(12) United States Patent
Hosono et al.

(10) Patent No.: US 6,376,916 B1
(45) Date of Patent: Apr. 23, 2002

(54) TAPE CARRIER FOR BGA AND SEMICONDUCTOR DEVICE USING THE SAME

(75) Inventors: Masayuki Hosono; Norio Okabe; Yasuharu Kameyama, all of Ibaraki (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 09/488,507

(22) Filed: Jan. 20, 2000

(30) Foreign Application Priority Data

Jan. 21, 1999 (JP) .......................................... 11-012956
Feb. 18, 1999 (JP) .......................................... 11-039406

(51) Int. Cl.[7] .............................................. H01L 29/40

(52) U.S. Cl. ...................................... 257/778; 257/737

(58) Field of Search ................................ 257/723, 737, 257/738, 778

(56) References Cited

U.S. PATENT DOCUMENTS 6,201,299 B1 * 3/2001 Tao et al. ................... 257/723

* cited by examiner

*Primary Examiner*—Roy Potter
(74) *Attorney, Agent, or Firm*—Scully, Scott, Murphy & Presser

(57) ABSTRACT

A semiconductor chip is mounted on a tape carrier by interposing an elastmer layer therebetween, so that thermal stress caused by a difference of thermal expansion coefficients of the semiconductor chip and the tape carrier is relieved. The tape carrier is structured by an insulating film and a plurality of leads formed on the insulating film. The insulating film has an opening for bonding the plurality of leads to the electrodes of the semiconductor chip, and the elastmer layer comprises first and second elastmer layers provided on the opposite sides of the opening to be separated around at least one end of the opening. The opening may be divided into a plurality of openings, in each of which a corresponding one or some of connected portions of the plurality of leads and the electrodes of the semiconductor chip are positioned, and sealing resins are filled in the plurality of openings to seal the connected portions.

5 Claims, 14 Drawing Sheets

TAPE CARRIER FOR BGA AND SEMICONDUCTOR DEVICE USING THE SAME

FIELD OF THE INVENTION

The invention relates to a tape carrier for BGA (Ball Grid Array) and a semiconductor device using the same, and more particularly to a tape carrier adapted to a semiconductor chip having pads arranged along the central line thereof, a tape carrier for mounting a flip-chip, and a semiconductor device using the same.

BACKGROUND OF THE INVENTION

In these days, a small sized package (semiconductor device) called CSP (Chip Size Package) of BGA structure using a tape carrier which is easy for high density wiring has been proposed in accordance with the demands of small size of packages and mounting of semiconductor chips with high density. In this type of a package, a semiconductor device is structured by mounting a semiconductor chip having electrodes arranged along the central line thereof on a stress-relieving resin layer fixed on one surface of an insulating tape having an opening.

FIG. 1 shows a conventional tape carrier comprising insulating film 1 of polyimide, etc, having rectangular-shaped film opening 2 in the central portion thereof to be used for bonding, inner leads 4 extended into film opening 2, patterned leads 3 and lands 5 for solder balls integrally formed with inner leads 4. Insulating film 1 is provided with silicone resin elastmer layer 6, on the side of forming leads 3 and solder ball lands 5, for relieving thermal stress in mounting semiconductor chip (not shown), wherein elastmer layer 6 has elastmer layer opening 61 similar to film opening 2.

FIG. 2 shows a cross-sectional structure of the conventional tape carrier along the line A—A' in FIG. 1.

FIGS. 3 to 5 show a conventional semiconductor device using the conventional tape carrier, wherein semiconductor chip 7 is mounted to be adhered to silicone resin elastmer layer 6. Semiconductor chip 7 is provided with a plurality of electrodes 8 linearly arranged along the central line thereof, and electrodes 8 of semiconductor chip 7 and inner leads 4 of the tape carrier are electrically connected at the position of film opening 2 and elastmer layer opening 61, wherein these electrically connected portions, and film and elastmer layer openings 2 and 61 are sealed by sealing resin 9 such as liquid epoxy resin, etc. Film and elastmer layer openings 2 and 61 serve a role for preventing injected liquid sealing resin 9 from being flowed out. Solder balls 10 are formed on solder ball lands 5 to be externally exposed and connected to an outer circuit (not shown).

Thus, the conventional semiconductor device is structured.

FIGS. 6A and 6B show another conventional semiconductor device of μBGA type CSP (Trademark of Tessera in the USA) which has been increasingly used, wherein the demands of enhancing the connecting reliability in thermal cycle and lowering the manufacturing cost are realized in addition to the formerly described demands.

In the semiconductor device 200 shown in FIGS. 6A and 6B, semiconductor chip 30 is mounted via elastmer 70 on tape carrier 100, so that electrodes of semiconductor chip 30 are electrically connected to leads of tape carrier 100, and electrically connected portions of the electrodes and the leads are sealed by sealing resin 50 injected into resin-sealing openings 40. In addition, solder balls 20 are arrayed on the side of tape carrier 100 opposite to the side on which semiconductor chip 30 is mounted.

FIG. 7 shows tape carrier 100 used for μBGA type CSP (semiconductor device) 200. Tape carrier 100 comprises an insulating film such as polyimide, etc. having through-holes 21 for mounting solder balls 20, and resin-sealing opening 40 for injecting sealing resin 50 to seal electrically connected portions of semiconductor chip 30 and leads 60 formed on the insulating film for connecting semiconductor chip 30 to solder balls 20.

In the conventional tape carrier (FIG. 1) and the conventional semiconductor device (FIG. 3), however, there are disadvantages in that voids occur inside sealing resin 9, because air existing in a space between film opening 2 and elastmer layer opening 61 is trapped by sealing resin 9 such as liquid epoxy resin, etc, when sealing resin 9 is injected into film opening 2 and elastmer layer opening 61, and that sufficient flatness of elastmer layer 6 such as silicone resin is not obtained, because such a method of using ordinary liquid resin to be printed and hardened is difficult to provide a flat surface. In addition, workability is difficult to be increased, because semiconductor chip 7 is adhered to elastmer layer 6 by using adhesive. Even worse, the separation occurs between semiconductor chip 7 and sealing resin 9 for the conventional semiconductor device (FIG. 3), because thermal stress which is generated under heat cycle, etc. at an interface between semiconductor chip 7 and sealing resin 9 in accordance with the difference of thermal expansion coefficients and stress which is caused by expansion of void 11 (FIG. 5) in sealing resin 9, are concentrated to an edge portion of sealing resin 9. The thermal stress causes the connected portions of inner leads 4 and electrodes 8 to be broken in a short period, thereby resulting in a defect in a circuit for the semiconductor device.

The conventional semiconductor device (FIGS. 6A and 6B) and the conventional tape carrier (Fig, 7) also have a disadvantage in that sealing resin 50 is concave in the vicinity of the central portion thereof as shown by arrows B, because injected sealing resin 50 is pulled towards a peripheral wall of opening 40 in accordance with surface tensile force thereof. Therefore, it is difficult to provide sealing resin 50 with a flat surface. In addition, there is a disadvantage in that the resin-sealing portion is positioned on only one side, unless leads 60 are arranged symmetrically thereby resulting in the deterioration of structural balance for a semiconductor device, because sealing resin 50 is provided to seal only the connecting portions of leads 60 and electrodes of semiconductor chip 30.

SUMMARY OF THE INVENTION

Accordingly, it is an object of the invention to provide a tape carrier for BGA and a semiconductor device using the same in which no void occurs inside a sealing resin.

It is another object of the invention to provide a tape carrier for BGA and a semiconductor device using the same in which the influence caused by thermal stress of a semiconductor chip mounted on the tape carrier is relieved against the tape carrier and a sealing resin.

It is a further object of the invention to provide a tape carrier for BGA and a semiconductor device using the same in which a sealing resin is formed to be flat, It is a still further object of the invention to provide a tape carrier for BGA and a semiconductor device using the same in which resin-sealing portions are formed to have structural balance.

According to the first feature of the invention, a tape carrier for BGA, comprises:

an insulating film having an opening for bonding in the middle thereof, a plurality of leads formed on the insulating film and projecting into the opening to provide a plurality of inner leads, and a plurality of lands connected with the plurality of leads, the plurality of leads and the plurality of lands being formed in a predetermined pattern, and elastomer layers for relieving thermal stress, the elastmer layers being provided on one surface of the insulating film by means of an adhesive so as to be located on opposite sides of the opening, and separated around at least one end of the opening.

According to the second feature of the invention, a semiconductor device, comprises:

a semiconductor chip having a plurality of electrodes on one surface thereof;

a BGA tape carrier comprising an insulating film having an opening for bonding in the middle thereof, a plurality of leads formed on the insulating film and projecting into the opening to provide a plurality of inner leads, and a plurality of lands connected with the plurality of leads, the plurality of leads and the plurality of lands being formed in a predetermined pattern on one surface of the insulating film;

elastomer layers for relieving thermal stress, the elastmer layers being positioned between the one surface of the insulating film and the one surface of the semiconductor chip;

a plurality of solder balls positioned on another surface of the insulating film to be connected with the plurality of lands;

and a sealing resin to seal connected portions of the plurality of inner leads and the plurality of electrodes; wherein:

the elastomer layers are located on opposite sides of the opening to be separated around at least one end of the opening.

According to the third feature of the invention, a tape carrier for BGA, comprises:

an insulating film having a plurality of openings for bonding, and a plurality of through-holes for mounting a plurality of solder balls, the plurality of openings being arranged along electrodes of a semiconductor chip to be mounted on the insulating film;

a plurality of leads formed on one surface of the insulating film, each of ends of the plurality of leads being projected into a corresponding one of the plurality of openings; and a plurality of lands for mounting the plurality of solder balls, the plurality of lands being formed on the one surface of the insulating film to be exposed via the plurality of through-holes to another surface of the insulating film.

According to the fourth feature of the invention, a semiconductor device, comprises:

a semiconductor chip having electrodes on one surface thereof;

an insulating film having a plurality of leads formed on one surface thereof in a predetermined pattern, and a plurality of lands formed on the one surface thereof, the insulating film being formed with a plurality of openings for bonding along the electrodes of the semiconductor chip and a plurality of through-holes for exposing the plurality of lands to another surface of the insulating film;

an elastomer layer positioned between the one surface of the semiconductor chip and the one surface of the insulating film for relieving thermal stress caused by a difference of thermal expansion coefficients of the insulating film and the semiconductor chip;

a plurality of solder balls mounted in the plurality of through-holes to be connected to the plurality of lands; and a plurality of sealing resins for filling the plurality of openings to seal connected portions of the electrodes of the semiconductor chip and the plurality of leads.

BRIEF DESCRIPTION OF THE DRAWINGS

The invention will be explained in more detail in conjunction with the appended drawing, wherein:

FIGS. 18A and 18B are explanatory views showing another shape of resin-sealing openings 40a.

DESCRIPTION OF THE PREFERRED EMBODIMENTS

A first preferred embodiment of the invention will be explained in detail with reference to FIGS. 8 to 12.

Figure 1:
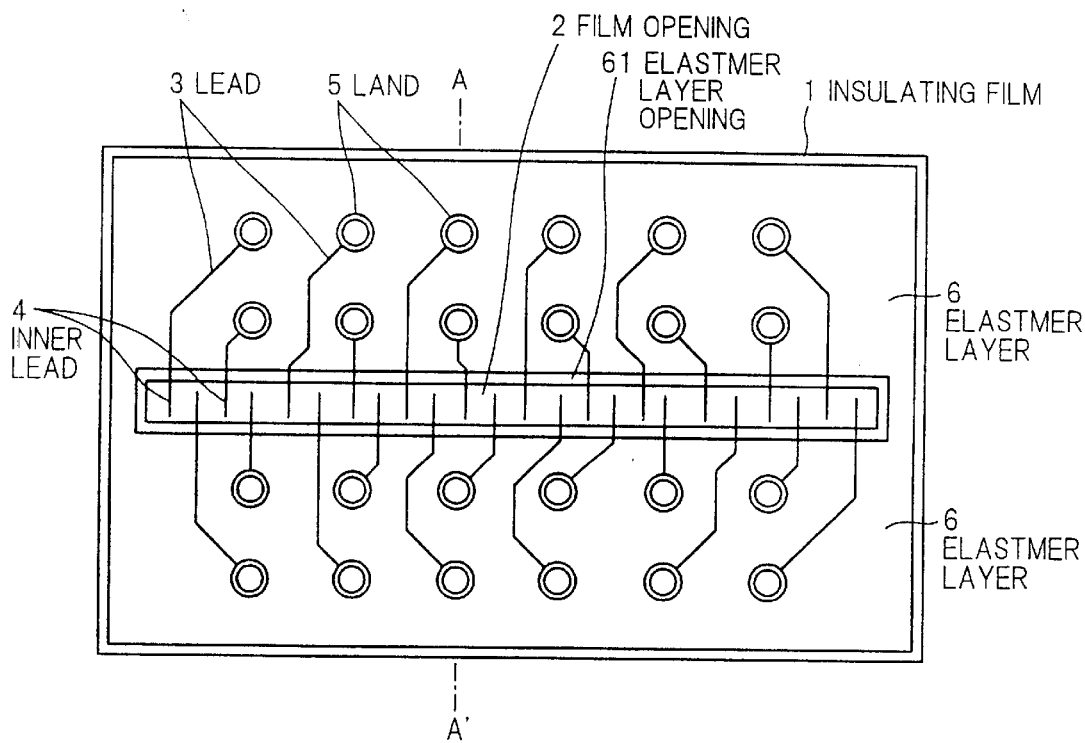
FIG. 1 is an explanatory plan view of a conventional tape carrier for a semiconductor device.
Figure 2:
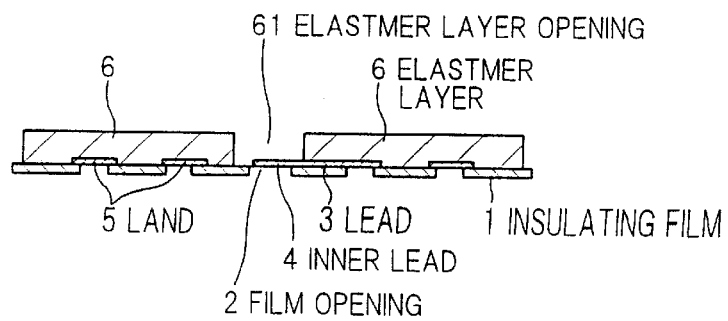
FIG. 2 is a transverse cross-sectional view of the conventional tape carrier in FIG. 1 along line A—A'.
Figure 3:
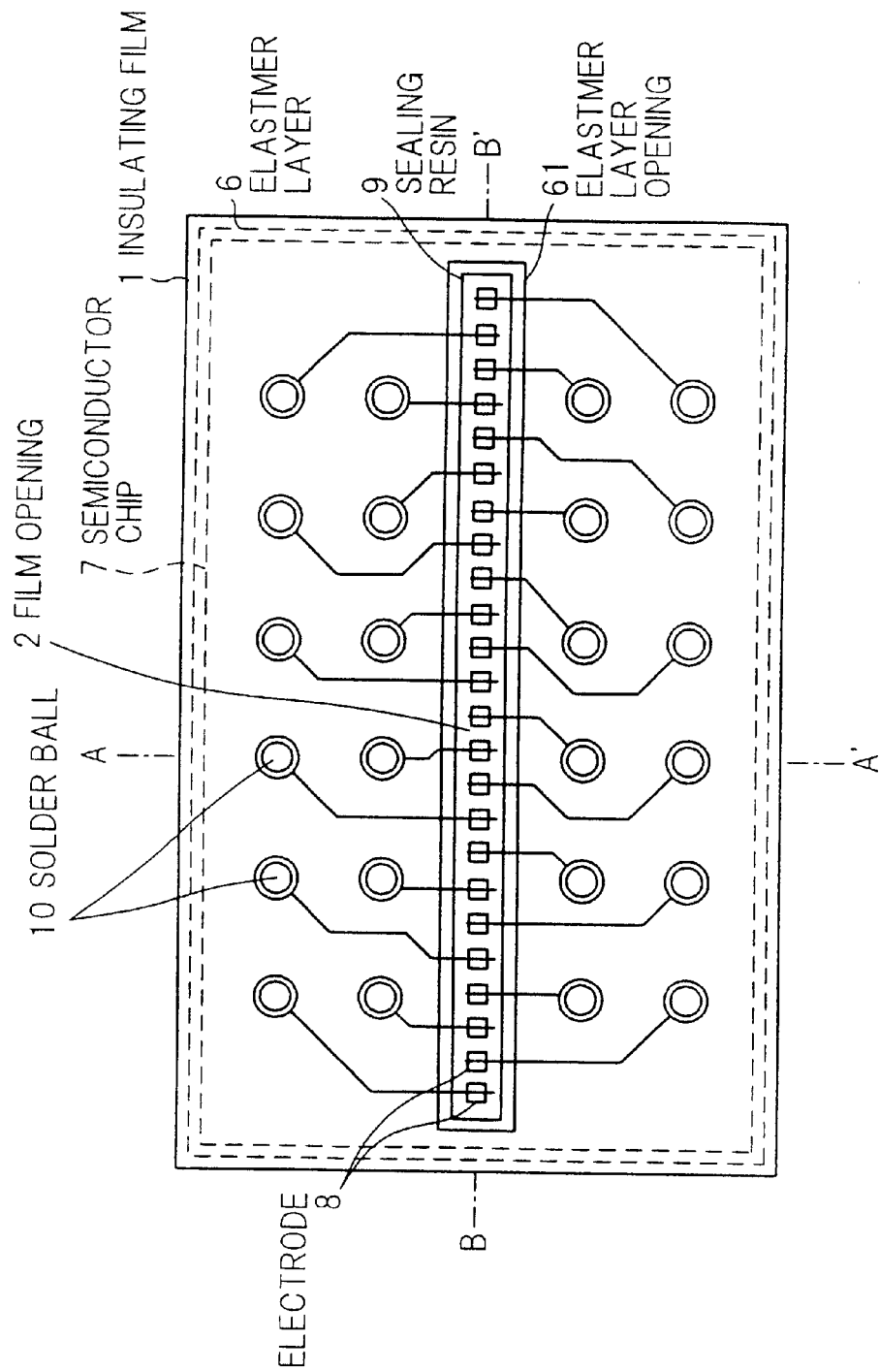
FIG. 3 is an explanatory plan view of a conventional semiconductor device using a conventional tape carrier.
Figure 4:
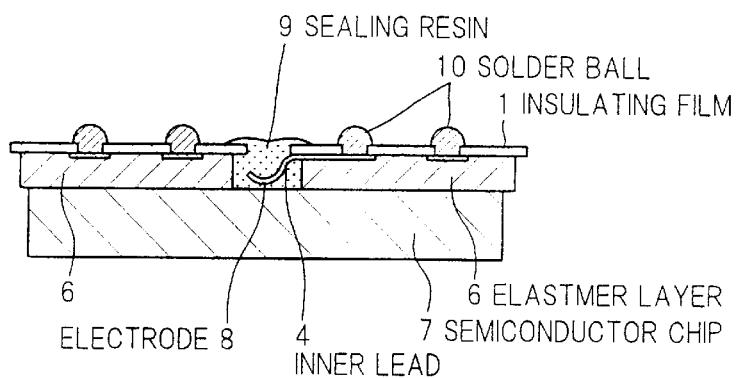
FIG. 4 is a transverse cross-sectional view of the conventional semiconductor device in FIG. 3 along line A—A'.
Figure 5:
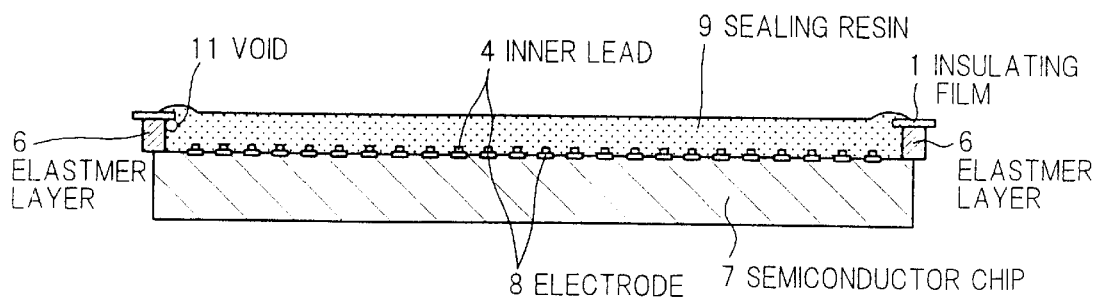
FIG. 5 is a longitudinal cross-sectional view of the conventional semiconductor device in FIG. 3 along line B—B'.
Figure 6A:
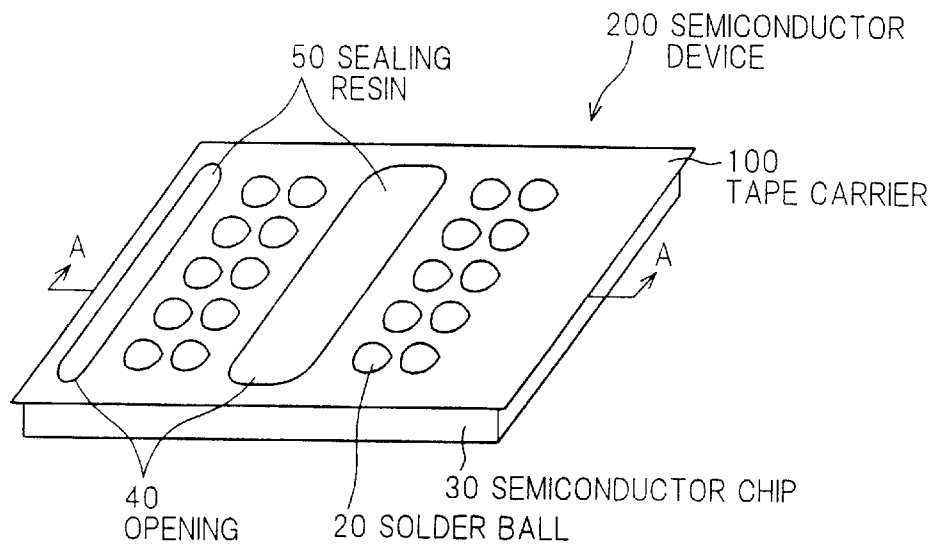
FIGS. 6A and 6B are explanatory views of the construction of a conventional μ-BGA type semiconductor device.
Figure 6B:
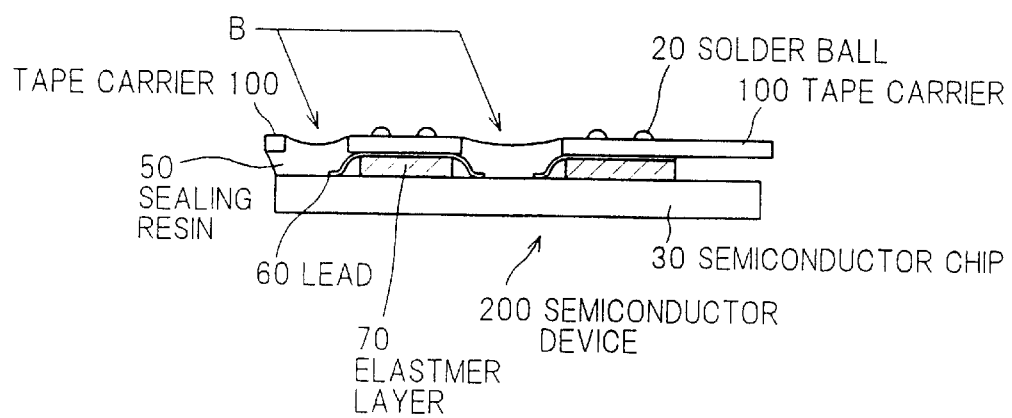
Figure 7:
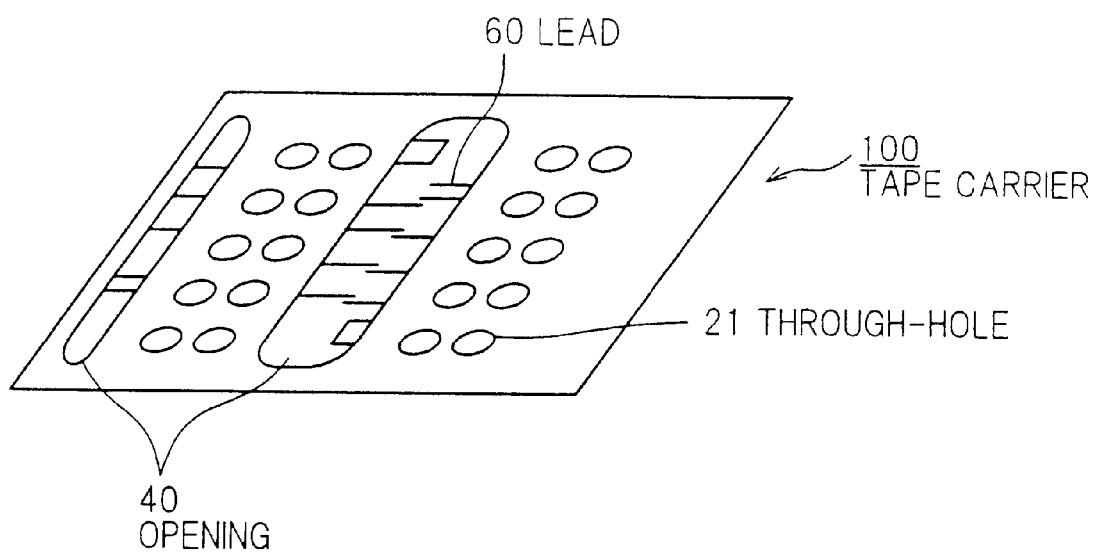
FIG. 7 is an explanatory view of the construction of a conventional tape carrier used in a conventional μ-BGA type semiconductor device.
Figure 8:
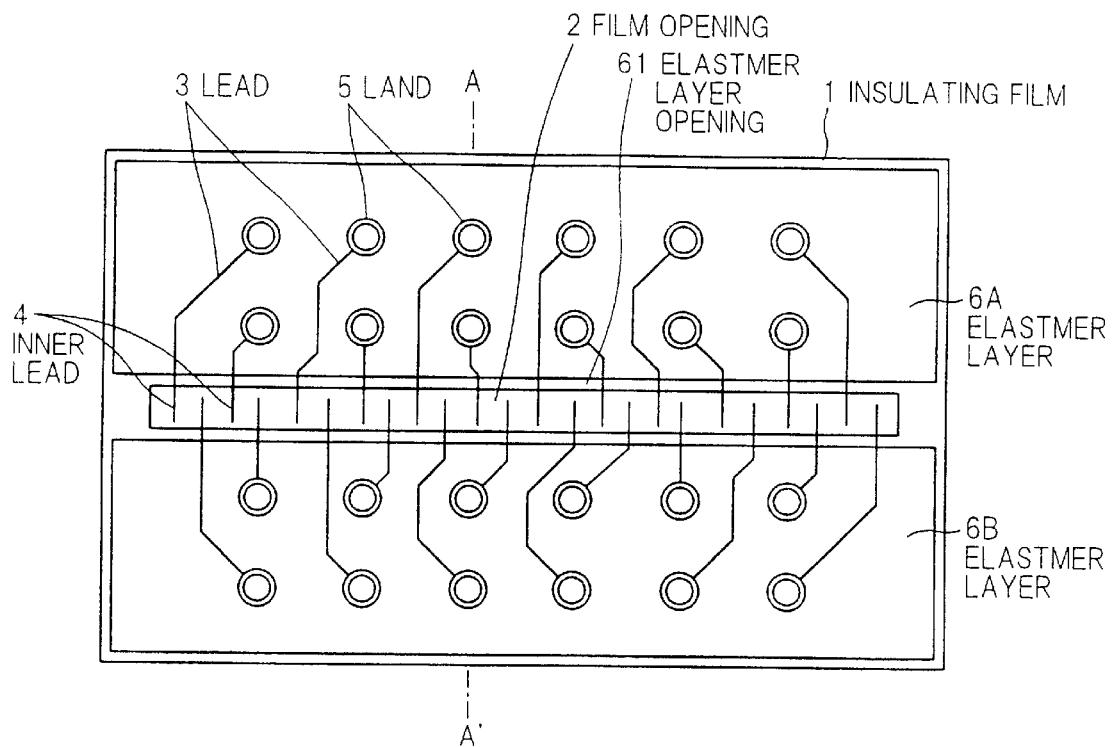
FIG. 8 is an explanatory plan view of a tape carrier for a semiconductor device in a preferred embodiment of the invention.

FIG. 8 shows the structure of a tape carrier for BGA according to a preferred embodiment of the invention. Tape carrier 1 comprises insulating film 1 made of polyimide or the like having adhesive layer on it and film opening 2 in rectangular shape formed in the middle thereof, inner leads 4 formed on insulating film 1 and projecting into film opening 2, patterned leads 3 made of copper plated with gold to be formed integrally with inner lead 4, and lands 5 for mounting a plurality of solder balls for electrical connection with an external circuit. On the surface of insulating film 1 elastmer layers 6A and 6B each consisting of low-elasticity epoxy resin and having adhesive layers on both surfaces are adhered for relieving thermal stress produced in mounting a semiconductor chip (not shown in FIG. 8), such that they are separated from each other to be located on opposite sides of film opening 2 provided in the central portion of insulating film 1. The elastomer layer 6A or 6B may be composed of a film having adhesives on both surfaces, in any form with a core film or without it.

Figure 9:
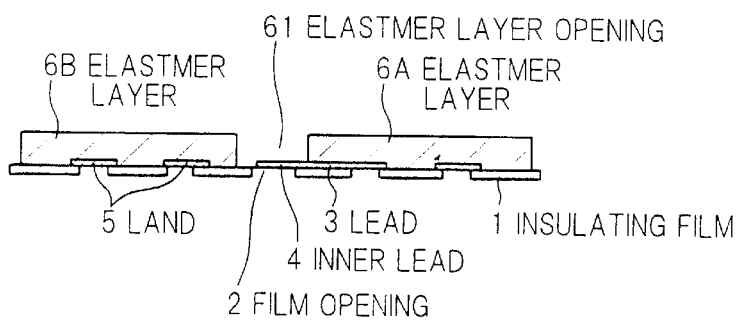
FIG. 9 is a transverse cross-sectional view of the tape carrier in FIG. 1 along line A—A'.

FIG. 9 is a cross-sectional view of the tape carrier in FIG. 8 along plane A—A'.

According to the invention, elastomer layers 6A and 6B are separated on at least one side of film opening 2. Elastomer layers 6A and 6B may be separated either around only one end of the opening or around both ends of the opening. In either case, the air trapped in the sealing resin injected into the opening in liquid form can be expelled successfully to the outside by way of the separation of elastomer layers 6A and 6B before the resin is hardened.

Figure 10:
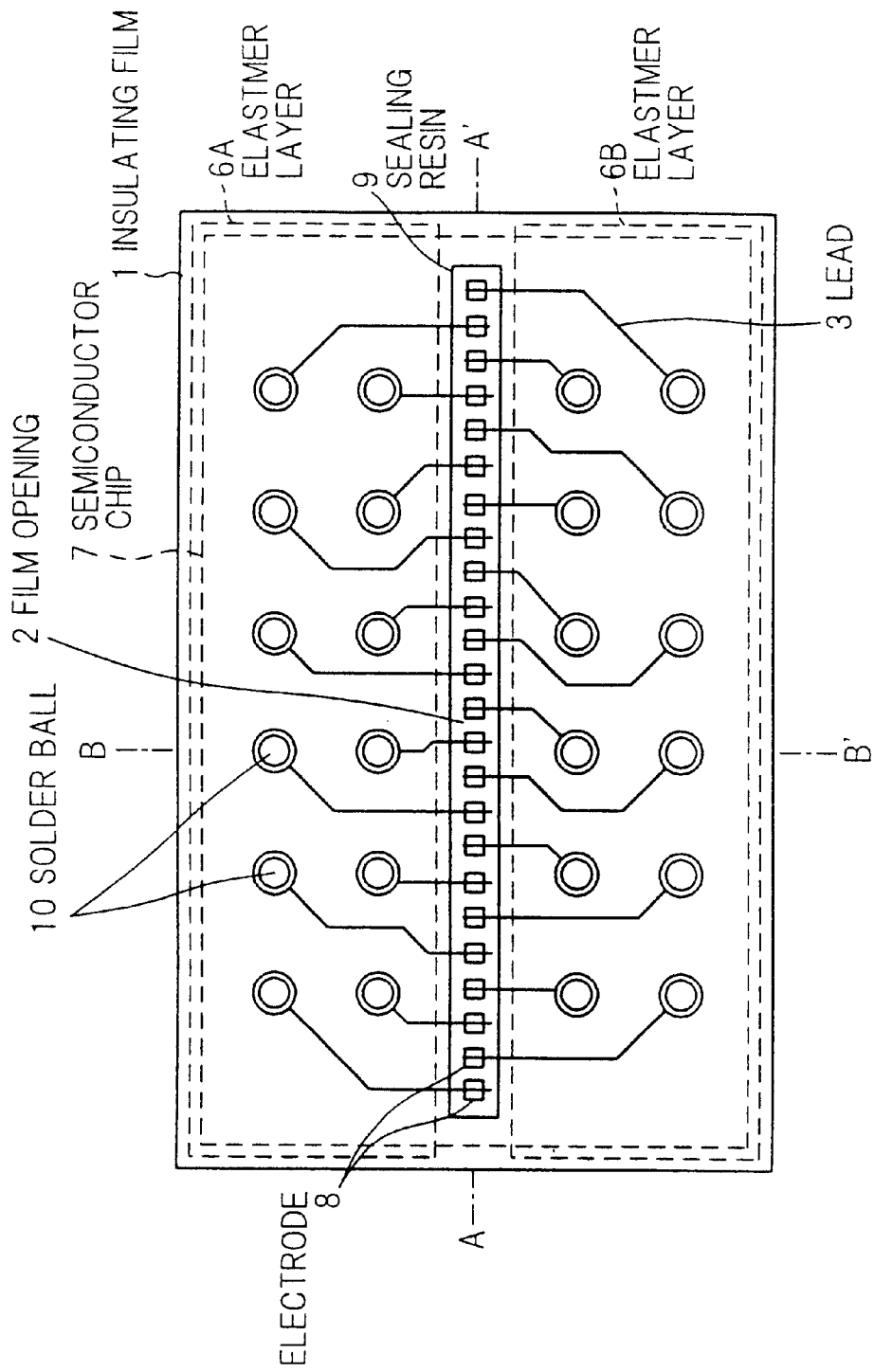
FIG. 10 is an explanatory plan view of a semiconductor device using a tape carrier in a preferred embodiment of the invention.

FIG. 10 shows the structure of a semiconductor device in the embodiment according to the invention. Semiconductor chip 7 is mounted on elastomer layers 6A and 6B which have been adhered to insulating film 1. Tape carrier consists of insulating film 1 made of polyimide or the like having an adhesive layer on its surface, in the middle of which film opening 2 is formed, and elastomer layers 6A and 6B adhered to insulating film 1 on one surface. Inner leads 4 connected to electrodes 8 of semiconductor chip 7 and lands 5 for connecting inner leads 4 to an external circuit are formed in a predetermined pattern, respectively, on one surface of insulating film 1. Elastomer layers 6A and 6B are attached to insulating film 1 on the surface thereof opposite to the surface on which lands 5 are formed.

Elastomer layers 6A and 6B on which semiconductor chip 7 is to be mounted are composed of a synthetic resin of low elasticity so as to reduce thermal stress due to the difference in thermal expansion coefficients between semiconductor chip 7 and the tape carrier composed of insulating film 1.

Solder balls 10 for connecting semiconductor chip 7 with an external circuit (not shown in FIG. 10) are formed on lands 5 on insulating film 1 to be exposed to the outside of the device. Inner leads 4 and electrodes B are connected in film opening 2, through which sealing resin 9 in liquid form is injected to seal the connecting sites hermetically. Thus, the semiconductor device is completed.

Figure 11:
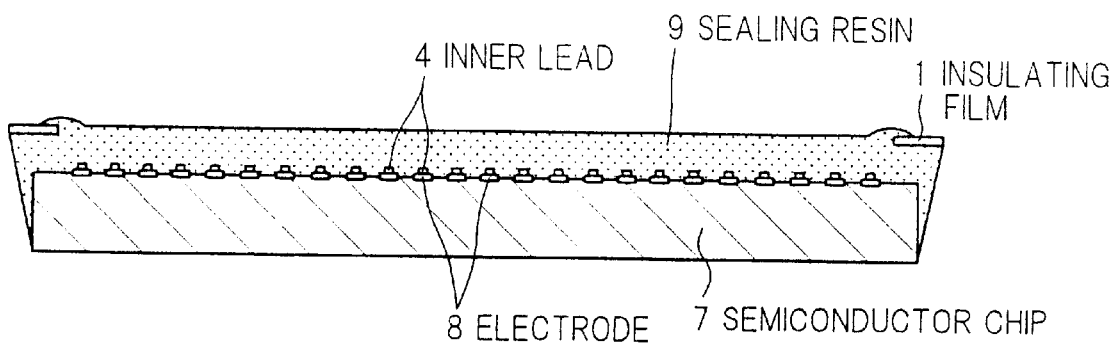
FIG. 11 is a transverse cross-sectional view of the semiconductor device in FIG. 10 along line A—A'.
Figure 12:
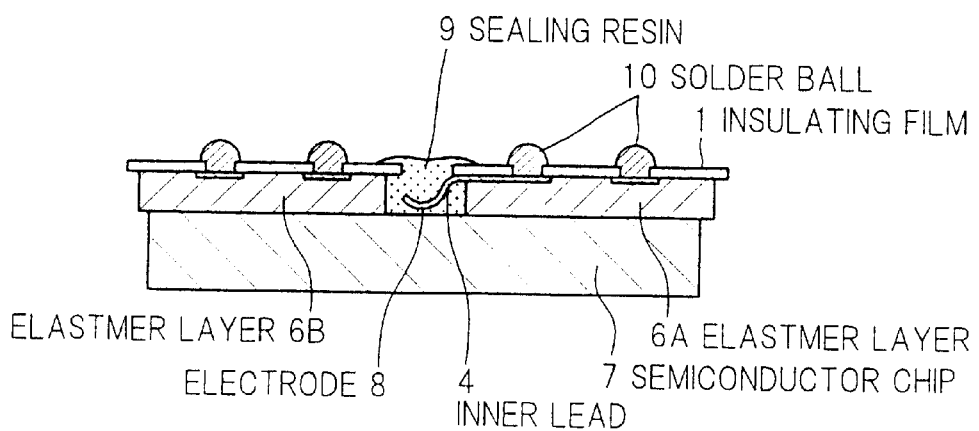
FIG. 12 is a longitudinal cross-sectional view of the semiconductor device in FIG. 10 along line B—B'.

FIG. 11 is a longitudinal cross-sectional view of the semiconductor device in FIG. 10 along line A—A'. FIG. 12 is a transverse cross-sectional view of the semiconductor device in FIG. 10 along line B—B'.

In the preferred embodiment of the semiconductor device in FIG. 10 according to the invention, sealing resin 9 such as epoxy resin in liquid form which is injected through film opening 2 passes along the edges of elastomer layers 6A and 6B and spreads to reach the edge of semiconductor chip 7 where electrodes 8 have been connected with inner leads 4. In the course of injection of the liquid resin, air bubbles enclosed within the resin flowing into film opening 2 and introduced into the space within film opening 2 escapes through at least one separated portion of elastomer layers 6A and 6B. Therefore, sealing resin 9 can be formed without producing voids due to air enclosed in the course of resin injection. Film opening 2 prevents sealing resin 9 consisting of liquid epoxy resin from flowing out when it is injected, and helps the resin to embed and seal the connecting sites of electrodes 8 hermetically. Local concentration of stress to electrodes 8 is prevented by sealing resin 9 because it shares the stress applied to electrodes 8.

Elastomer layers 6A and 6B located on both sides of film opening 2 may be separated around only one end of the opening. Even in such a case, the air enclosed in the liquid resin injected to film opening 2 can be expelled successfully out of the opening through the separated portion of elastomer layers 6A and 6B.

Insulating film 1 suited for tape carrier 1 used in this invention is an insulating plastic film having sufficient flexibility, heat resistance, facility of handling and uniformity in thickness, for example, polyimide film. Adhesive is applied to one or both surfaces of insulating film 1. For preparing tape carrier 1, insulating film 1 is punched by means of a punch and a die or the like so as to form film opening 2. Metal film such as copper foil is used as a material for constituting a lead pattern. A lead pattern including inner leads, lands for mounting solder balls and leads for connecting the inner leads and the lands can be formed by, for example, lamination of copper foil onto an insulating film having adhesive on its surface and forming of an opening, followed by photo-lithographic process and etching process.

The mount of a semiconductor chip on a tape carrier with adhesive is conducted by heating them with pressure applied to the adhesive, with the electrodes and the leads on the tape carrier being aligned. The inner leads projecting into an opening of the tape carrier are directly connected with electrode pads on the chip by single-point bonding method, or otherwise, by wire bonding with gold wires or the like.

Elastomer layers of low elasticity resin are used in the tape carrier or in the semiconductor device according to the invention, in order to reduce the thermal stress caused by the difference in thermal expansion between the semiconductor chip to be mounted and the tape carrier or any other external substrate. Elastomer layers are suitably composed of adhesive films of low elasticity resin such as elastomer, plastomer or the like. Liquid resins of thermal hardening type such as epoxy resin is used as a sealing resin. Coating of a resin can be performed by potting method in which the liquid resin is coated from above the opening of the tape carrier by using a dispenser.

EXAMPLES (Semiconductor Device in the Invention)

A tape carrier is prepared by forming a lead pattern composed of copper foil of 18 microns in thickness plated with gold on a base film of polyimide of 50 microns in thickness having an adhesive layer of 12 microns in thickness, in the middle of which an opening is formed so as to confront the electrodes on a chip to be mounted. A tape carrier in accordance with the invention is produced on which elastomer layers composed of epoxy resin film of 150 microns in thickness having adhesives on both surfaces are provided on the both sides of the film opening formed in the middle of the base film.

After a semiconductor chip having thickness of 0.3 mm, width of 8 mm and length of 15 mm is mounted on the elastomer layers of the tape carrier by the help of adhesive surfaces of the layers, the leads on the tape carrier and the electrodes on the chip are connected, liquid epoxy resin (viscosity at 25° C. is 10 Pa sec.) is injected over the film opening and hardened by heat and, further, solder balls are mounted on the lands. Thus a semiconductor device of the invention is completed.

(Semiconductor Device for Comparative Example)

A semiconductor device is prepared for comparative example, using a tape carrier having an elastomer layer having no separated portion around the opening in the middle of the tape carrier.

With respect to the semiconductor device in the invention and the semiconductor device for comparative example, the presence of void trapped in the sealing resin near the ends of the opening and the ratio of troubles caused in heat cycle test (−55° C./30 min. to 125° C./30 min.) are observed. The results are shown in Table 1. The trouble in the comparative example in heat cycle test is disconnection near the ends of the sealing resin between the leads and the electrodes.

TABLE 1

The occurring ratio of enclosed voids in the sealing resin and the results of heat cycle test.

| Items | | the invention | comparative example |
|---|---|---|---|
| The occurrence of voids | | 0% | 15% |
| The ratio of trouble in heat cycle test (number of troubles/ number of tests) | 200 cycles | 0/50 | 5/50 |
| | 500 cycles | 0/50 | 18/50 |
| | 1000 cycles | 0/50 | 33/50 |

In the BGA tape carrier and the semiconductor device according to the invention, the elastomer layers are provided on both sides of the opening formed in the middle of the tape carrier, such that they are separated around at least one end of the opening, whereby air is prevented from being trapped within the sealing resin which is injected for sealing the connection sites of the inner leads of the tape carrier with the electrodes on the semiconductor chip, because the air bubbles introduced into the space within the opening can escape through the separated portion(s) of the elastomer layers, so that air-tight sealing by the sealing resin is made possible. Moreover, flowing of the sealing resin is promoted owing to the absence of air. Accordingly, a BGA tape carrier and a semiconductor device using the same are provided to have good quality according to the invention, owing to prevention of voids within the sealing resin.

In the BGA tape carrier and the semiconductor device according to the invention, the elastomer layers located on both sides of the opening formed in the middle of the tape carrier is separated around at least one end of the opening, whereby flow as well as spreading of liquid resin toward the end surfaces of a semiconductor chip are facilitated and the connection sites of the electrodes are covered with the sealing resin uniformly and hermetically enough. Thus, thermal stress between the sealing resin and the semiconductor chip can be reduced, improving significantly the reliability of a semiconductor device in thermal stress such as temperature cycle. Surfaces of elastomer layer composed of adhesive films made of low elasticity resin are so smooth that contact of the insulating film of a tape carrier with a semiconductor chip is facilitated. Accordingly, a reliable BGA tape carrier and a semiconductor device using the same are provided according to the invention.

A second preferred embodiment of the invention will be explained in detail with reference to FIGS. 13 to 18A and 18B.

Figure 13:
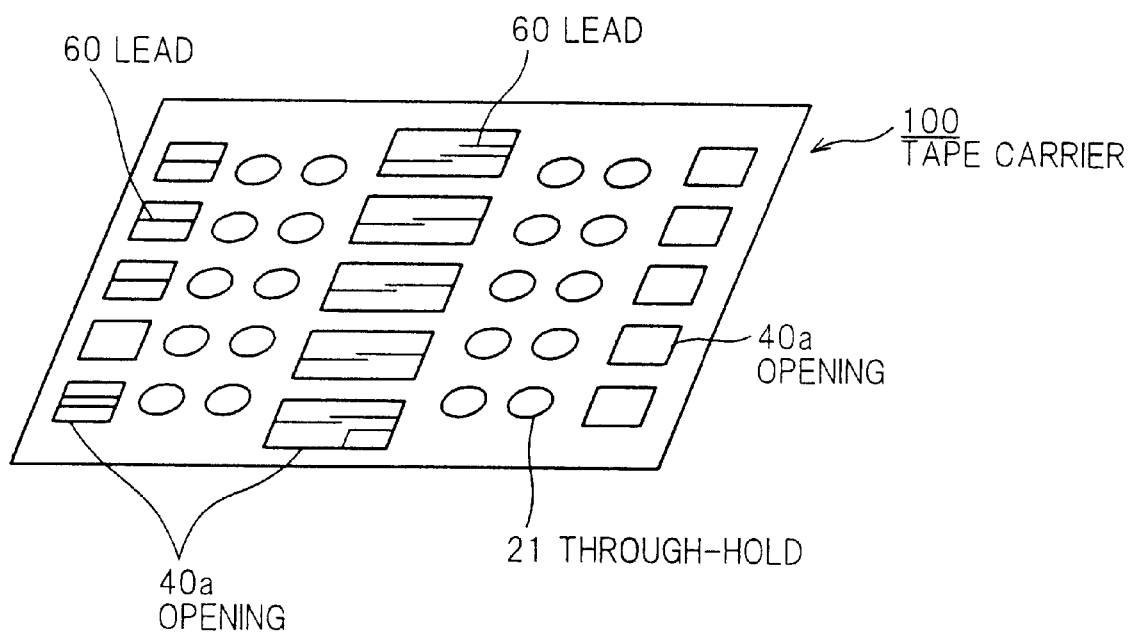
FIG. 13 is an explanatory view of the construction of a BGA tape carrier used in a μ-BGA type semiconductor device according to a preferred embodiment of the invention.

FIG. 13 is an explanatory view of the construction of a BGA tape carrier used for a μ-BGA type semiconductor device in the second preferred embodiment of the invention.

As shown in FIG. 13, BGA tape carrier 100 comprises solder ball-mounting through-holes 21 for mounting solder balls 20 (see FIG. 14A and 14B) on an insulating tape made of polyimide etc, leads 60 made of copper foil etc. on the insulating tape and resin-injection openings 40a, divided into some segments, for electrical connection between leads 60 and semiconductor chip 30 as well as for injection of sealing resin.

Each of resin-injection openings 40a is a small opening which is different from a single long opening of a large area in a conventional tape carrier.

Resin-injection through-holes 40a must have a size at least required for electrical connection to be easily made between the electrode pads formed on the surface of semiconductor chip 30 and leads 60 as well as for smooth flowing of sealing resin injected into the openings. The arrangement of resin-sealing openings 40a may be varied depending on the pattern of leads 60.

In this embodiment, resin-injection openings 40a are located not only in the portion where leads 60 are present but also in the portion where leads 60 are not formed Thus, the structural balance of μ-BGA type semiconductor device is improved as the whole after resin-sealing since the resin sealing is provided either in the area of leads 60 and the area having no lead. BGA tape carrier 100 may be provided with an elastomer layer, as described later, in the case where it is supplied to a market as an independent product by itself.

A μ-BGA type semiconductor device using BGA tape carrier 100 in the embodiment will be described below.

Figure 14A:
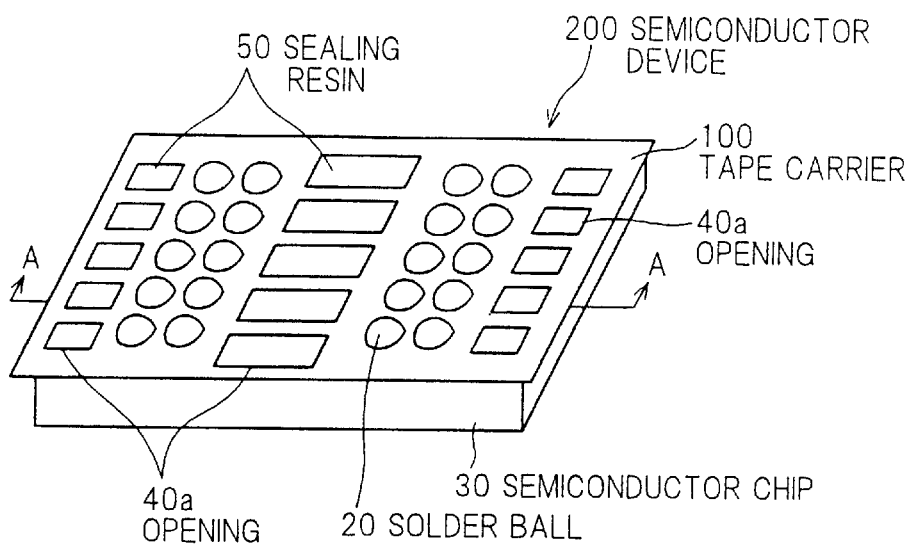
FIGS. 14A and 14B are explanatory views of the construction of a μ-BGA type semiconductor device in the preferred embodiment.
Figure 14B:
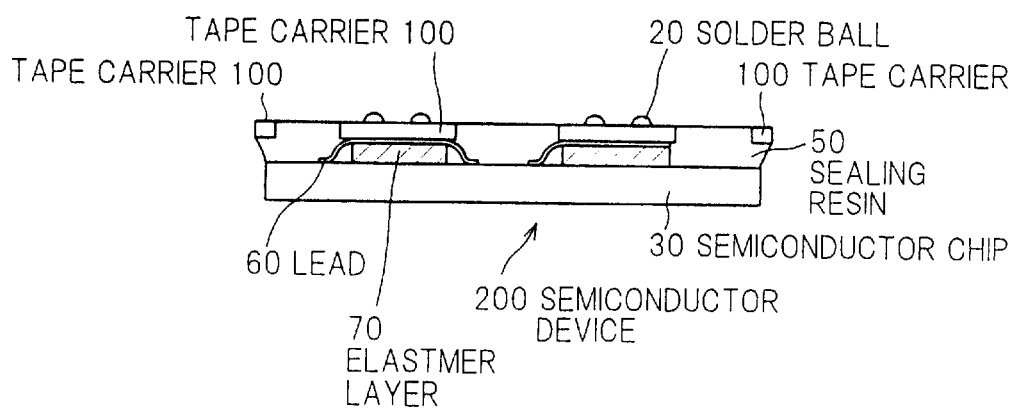

FIGS. 14A and 14B are explanatory views of the construction of the μ-BGA type semiconductor device in this embodiment. wherein FIG. 14A is a perspective view of the μ-BGA type semiconductor device in this embodiment, and FIG. 14B is a cross-sectional view thereof along line A—A in FIG. 14A.

In the μ-BGA type semiconductor device 200 in the present embodiment, as shown in FIG. 14A, BGA tape carrier 100 shown in FIG. 13 and semiconductor chip 30 are connected electrically, the connected portion is resin-sealed from resin-injection openings 40a formed in BGA tape carrier 100 by injecting sealing resin 50, and solder balls 20 are mounted in an alley on the surface of BGA tape carrier 100 opposite to that having semiconductor chip 30 mounted.

The electrical connection between BGA tape carrier 100 and semiconductor chip 30 is conducted, as shown in FIG. 14B, interposing elastomer layers 70, which serve to absorb thermal stress between BGA tape carrier 100 and semiconductor chip 30.

The method for producing the μ-BGA type semiconductor device according to the embodiment will be explained hereafter with reference to FIG. 15 to FIGS. 17A to 17C.

Figure 15:
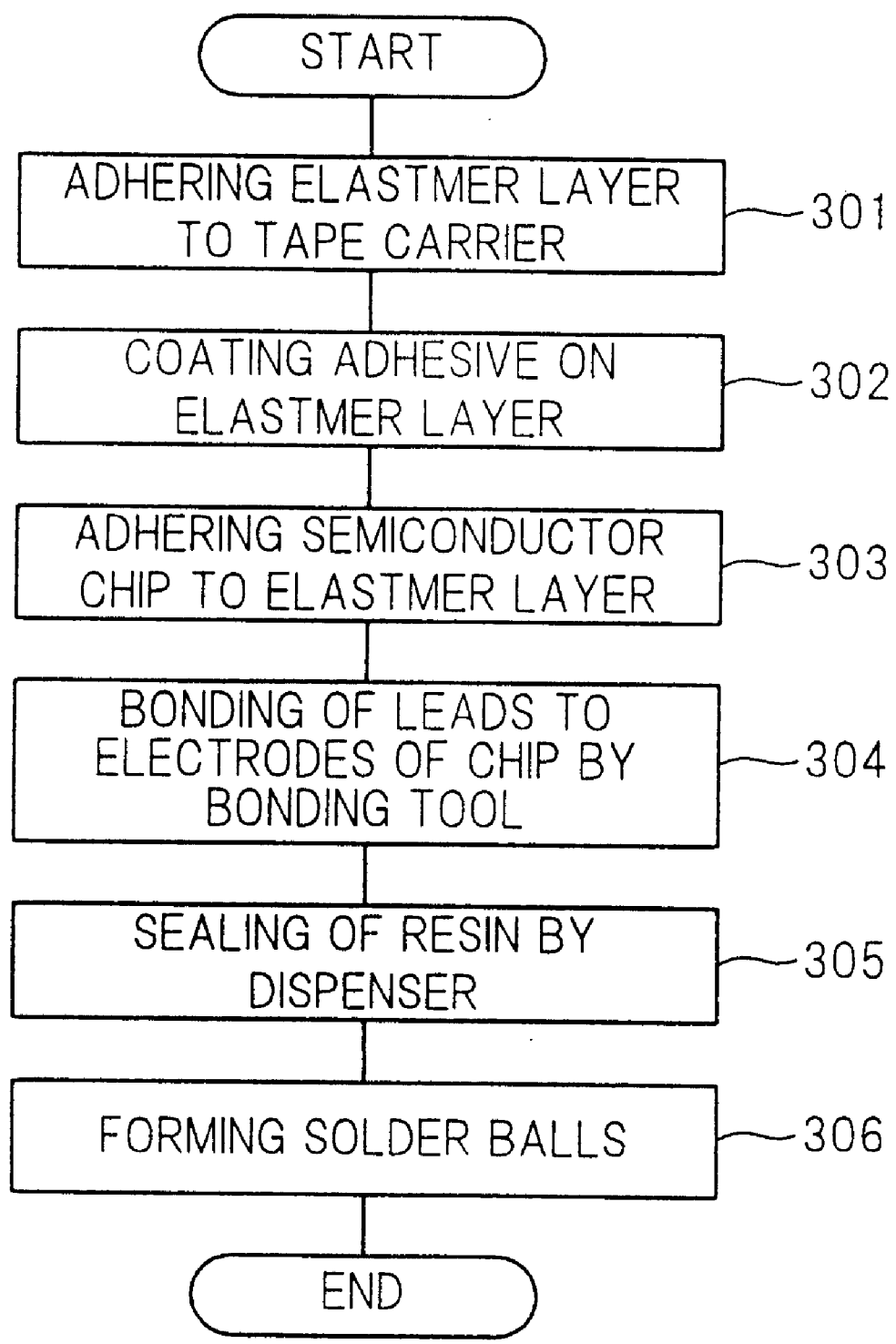
FIG. 15 is a flow chart showing a method for manufacturing the μ-BGA type semiconductor device in the preferred embodiment.
Figure 16A:
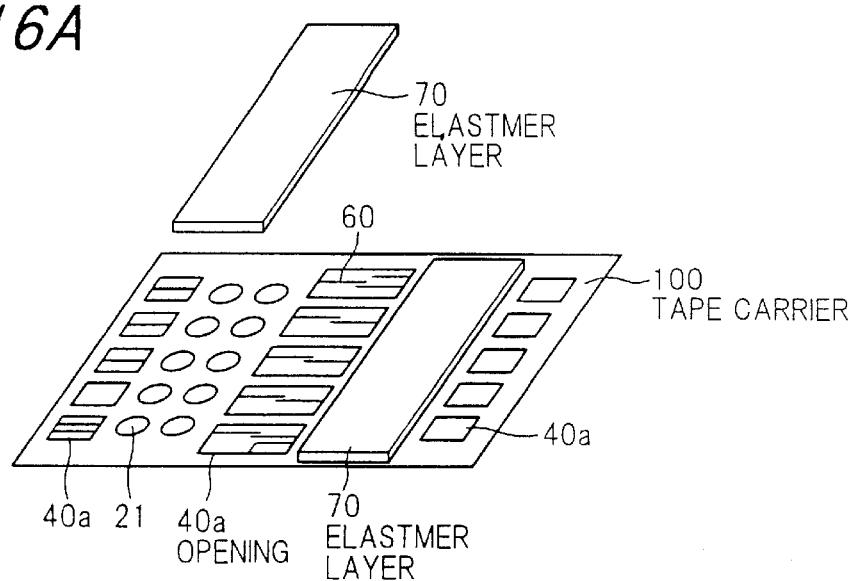
FIGS. 16A to 16C are an explanatory views showing the method for manufacturing the μ-BGA type semiconductor device in the preferred embodiment.
Figure 16B:
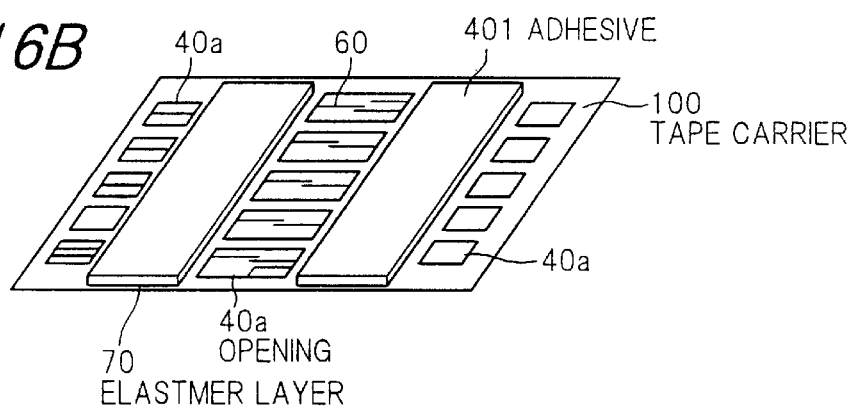
Figure 16C:
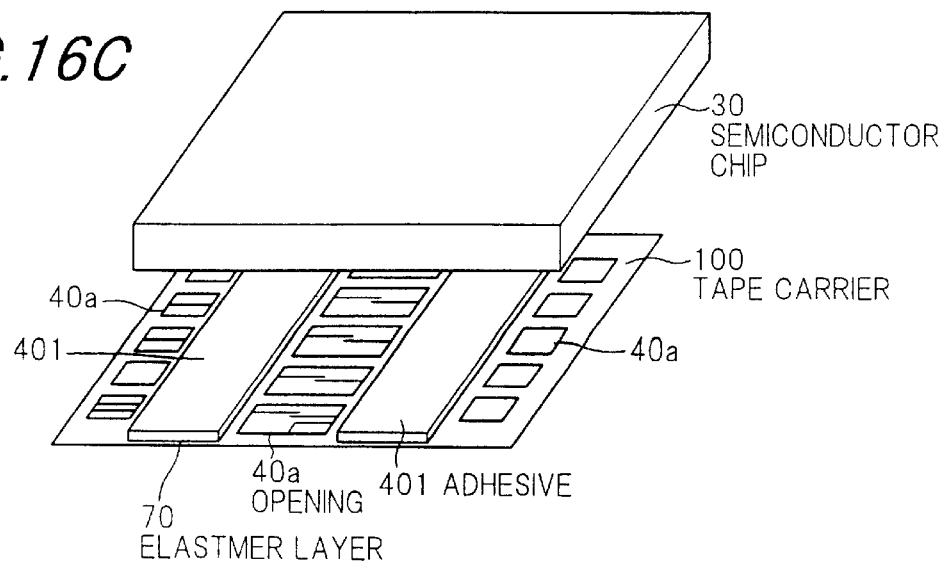

FIG. 15 is a flow chart showing the method for producing the μ-BGA type semiconductor device in the embodiment. In the method for producing a μ-BGA type semiconductor device according to the embodiment, elastomer layer 70 is attached on the side of BGA tape carrier 100 where a lead pattern is present as shown in FIG. 16A (Step 301), the surface of elastomer layer 70 on which the semiconductor chip is to be attached is coated with adhesive 401 as shown in Fig, 16B (Step 302), and semiconductor chip 30 is mounted on elastomer layer 70 by means of the adhesive as shown in FIG. 16C (Step 303). As elastomer layer 70, a tape made of, for example, poly-imide family or fluorocarbon resins is utilized. Epoxy resins may be used as the adhesive.

Elastomer layer 70 is sometimes provided with adhesive. Step 302 is skipped if elastomer layer 70 with adhesive is used.

Figure 17A:
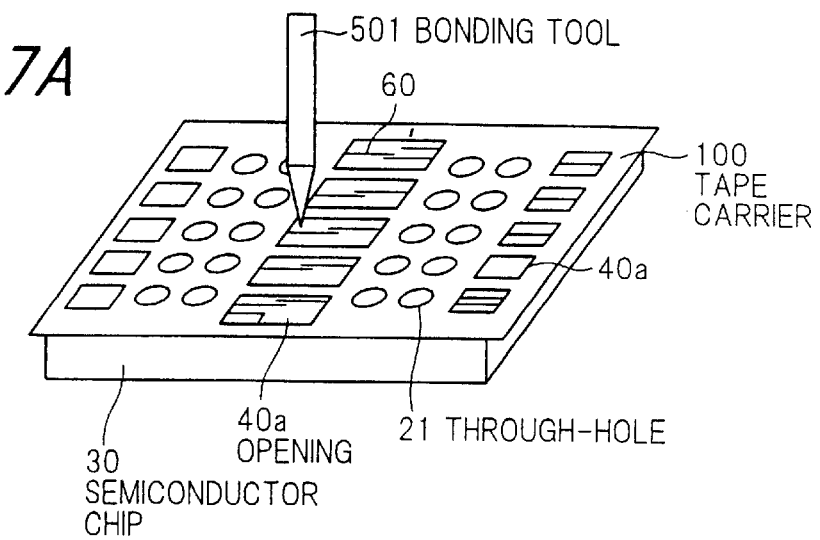
FIGS. 17A to 17C are explanatory views showing the method for manufacturing the μ-BGA in the preferred embodiment.
Figure 17B:
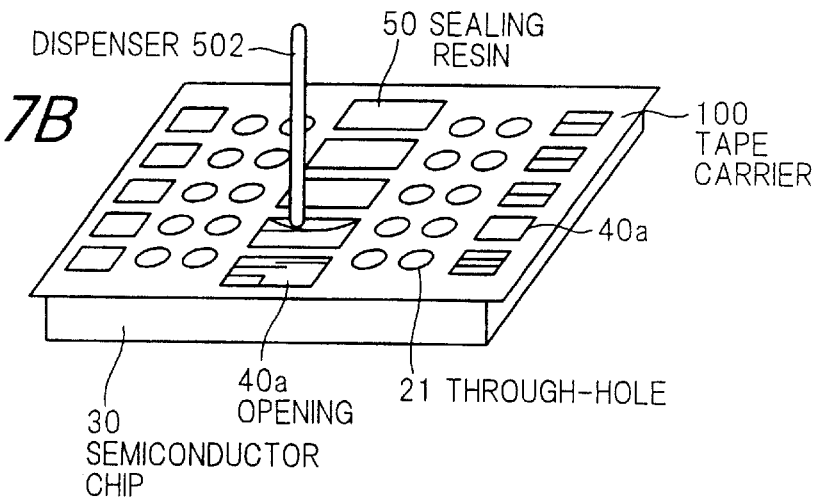
Figure 17C:
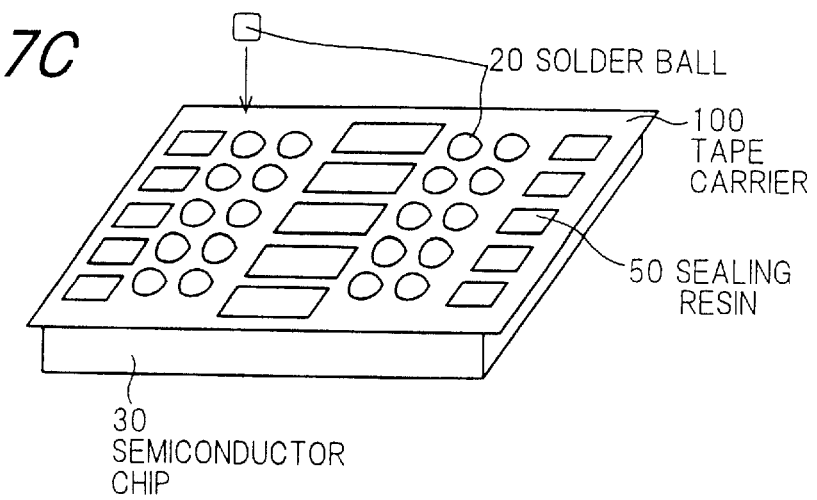

Then, a bonding process to connect leads 60 with the electrode pads of semiconductor chip 30 is carried out by means of bonding tool 501 as shown in FIG. 17A (Step 304), and sealing resin 50 is injected from resin-injection through-holes 40a by means of dispenser 502 as shown in FIG. 17B (Step 305). A resin of slightly lower viscosity than that used conventionally is used for resin-sealing because the opening area of each resin-injection opening 40a is smaller than that of conventional one. Then, solder balls 20 are mounted as shown in FIG. 17C (Step 306).

Figure 18A:
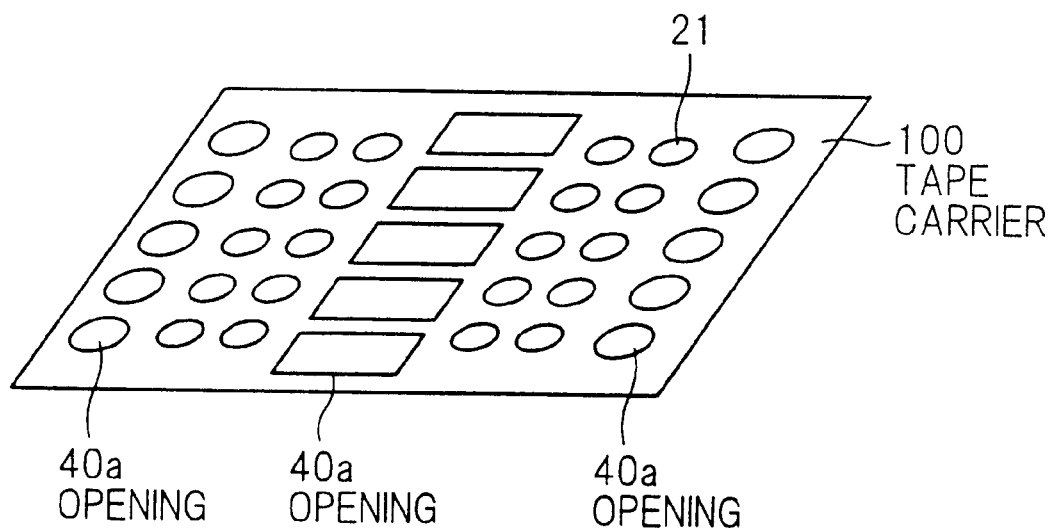
Figure 18B:
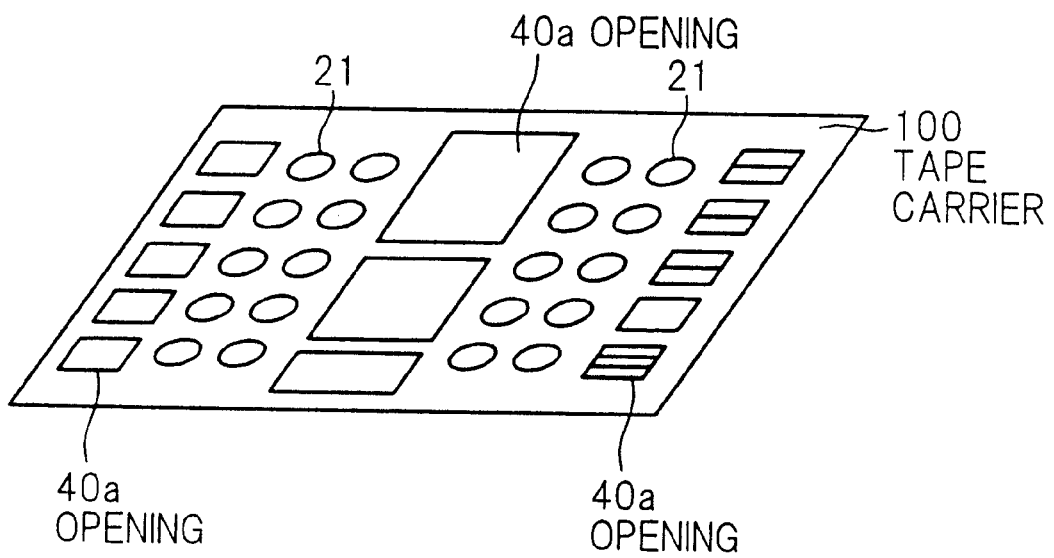

Though any of resin-injection openings 40a provided on BGA tape carrier 100 in this embodiment has a rectangular shape as shown in FIG. 13, they may have rounded corners as shown in FIG. 18A or may have different sizes and shapes depending on a pattern of leads 60 as shown in FIG. 18B, and need not be aligned regularly.

As a plurality of openings to form segments are provided for injection of the sealing-resin, each opening is smaller in area than a single opening for resin injection in a conventional tape carrier. Owing to the smaller area of each injection opening, a concaved surface of the sealing resin formed by surface tension pulling the resin toward the side walls surrounding the openings is diminished, facilitating flat-surfaced resin-sealing.

Further, in the semiconductor device according to the invention, as resin-injection is carried out through resin-injection openings 40a provided in the portion of BGA tape carrier having no lead as well as in the portion having leads (refer to FIG. 17A), the localization of the sealing resin is diminished, eliminating the mechanical imbalance of the whole semiconductor device due to the localization of sealing resin. Cracks of a semiconductor chip or separation of a semiconductor chip from the tape carrier caused by uneven stress due to such mechanical imbalance is prevented, thereby the reliability of semiconductor devices is improved.

In addition, as a total area of the resin-sealing opening may be sometimes smaller than conventional one, increasing the working area of BGA tape carrier in proportion, toughness of the semiconductor device then is improved.

Although the invention has been described with respect to specific embodiments for complete and clear disclosure, the appended claims are not to be thus limited but are to be construed as embodying all modification and alternative constructions that may occur to one skilled in the art which fairly fall within the basic teaching herein set forth.

What is claimed is:

1. A semiconductor device, comprising:
   a semiconductor chip having a plurality of electrodes on one surface thereof:
   a BGA tape carrier comprising an insulating film having an opening for bonding in the middle thereof, a plurality of leads formed on said insulating film and projecting into said opening to provide a plurality of inner leads, and a plurality of lands connected with said plurality of leads, said plurality of leads and said plurality of lands being formed in a predetermined pattern on one surface of said insulating film;
   elastomer layers for relieving thermal stress, said elastmer layers being positioned between said one surface of said insulating film and said one surface of said semiconductor chip;
   a plurality of solder balls positioned on another surface of said insulating film to be connected with said plurality of lands; and
   a sealing resin to seal connected portions of said plurality of inner leads and said plurality of electrodes; wherein:
   said elastomer layers are located on opposite sides of said opening to be separated around at least one end of said opening.

2. The semiconductor device as defined in claim 1, wherein,
   each of said elastomer layers is composed of an adhesive film formed of low-elasticity resin.

3. The semiconductor device as defined in claim 1, wherein:
   said elastomer layers are separated around both ends of said opening.

4. A semiconductor device, comprising:
   a semiconductor chip having electrodes on one surface thereof;
   an insulating film having a plurality of leads formed on one surface thereof in a predetermined pattern, and a plurality of lands formed on said one surface thereof, said insulating film being formed with a plurality of openings for bonding along said electrodes of said semiconductor chip and a plurality of through-holes for exposing said plurality of lands to another surface of said insulating film;
   an elastomer layer positioned between said one surface of said semiconductor chip and said one surface of said insulating film for relieving thermal stress caused by a difference of thermal expansion coefficients of said insulating film and said semiconductor chip;
   a plurality of solder balls mounted in said plurality of through-holes to be connected to said plurality of lands; and
   a plurality of sealing resins for filling said plurality of openings to seal connected portions of said electrodes of said semiconductor chip and said plurality of leads.

5. The semiconductor device as defined in claim 4, wherein;
   said plurality of openings are partially provided on an area of said insulating film where said plurality of leads are formed, while a remaining of said plurality of openings are provided on an area of said insulating film where said plurality of leads are not formed.

* * * * *